(12) United States Patent
Wu et al.

(10) Patent No.: US 8,299,870 B2
(45) Date of Patent: Oct. 30, 2012

(54) PROGRAMMABLE GAIN ATTENUATOR WITH A WIDE ATTENUATION RANGE AND A FINE ATTENUATION STEP SIZE

(75) Inventors: Tao Wu, Irvine, CA (US); Ramon Gomez, San Juan Cap, CA (US)

(73) Assignee: Broadcom Corporation, Irvine, CA (US)

(*) Notice: Subject to any disclaimer, the term of this patent is extended or adjusted under 35 U.S.C. 154(b) by 422 days.

(21) Appl. No.: 12/689,549

(22) Filed: Jan. 19, 2010

(65) Prior Publication Data
US 2011/0140812 A1 Jun. 16, 2011

Related U.S. Application Data

(60) Provisional application No. 61/285,812, filed on Dec. 11, 2009.

(51) Int. Cl.
*H01P 1/22* (2006.01)
*H03G 3/20* (2006.01)

(52) U.S. Cl. ...................................... 333/81 R; 327/308

(58) Field of Classification Search ................ 333/81 R; 327/308, 309
See application file for complete search history.

(56) References Cited

U.S. PATENT DOCUMENTS
2007/0105517 A1* 5/2007 Chang et al. ............... 455/249.1
* cited by examiner

*Primary Examiner* — Stephen Jones
(74) *Attorney, Agent, or Firm* — Sterne, Kessler, Goldstein & Fox P.L.L.C.

(57) ABSTRACT

A programmable gain attenuator (PGA) configured to receive a signal at an input and provide an attenuated version of the signal at an output is provided herein. The PGA includes a resistor coupled between a first tap and a second tap, where the first tap is coupled to the input of the PGA. The PGA further includes two sets of switches. The first set of switches is coupled in parallel between the first tap and the output, and the second set of switches is coupled in parallel between the second tap and the output. The attenuation setting of the programmable gain attenuator can be determined by controlling each set of switches.

13 Claims, 6 Drawing Sheets

(Wide Gain Range, Fine Step PGA)

FIG._1 (AGC Loop)

FIG._2 (Conventional PGA)

FIG._3 (Wide Gain Range, Fine Step PGA)

FIG._4 (Weighted Switch Distributions)

FIG._5 (Switch Connections)

PROGRAMMABLE GAIN ATTENUATOR WITH A WIDE ATTENUATION RANGE AND A FINE ATTENUATION STEP SIZE

CROSS REFERENCE TO RELATED APPLICATIONS

This patent application claims the benefit of U.S. Provisional Patent Application No. 61/285,812, filed Dec. 11, 2009, entitled "A Programmable Gain Attenuator With a Wide Attenuation Range and a Fine Attenuation Step Size," which is incorporated herein be reference in its entirety.

FIELD OF THE INVENTION

This application relates generally to amplifiers and/or attenuators, and more particularly to programmable gain amplifiers and/or attenuators (PGAs).

BACKGROUND

In electronic communications, electromagnetic signals carry information between two nodes over a connecting medium. The signal strength at the receiving node varies depending on the distance between the nodes and changes in the condition of the medium. For instance, the signal strength typically decreases with increasing distance between the two nodes. Furthermore, even if the distance is fixed, physical variations in the medium over time can affect signal strength. For example, in a cable system, different cables can have different attenuation constants. Also, changes in atmospheric conditions between transmitting and receiving antennas in a broadcast system, or multipath interference due to reflections from moving objects such as cars or airplanes, or changes in the gains of repeater amplifiers in cable television systems due to outdoor temperature changes can affect the signal strength at the receiver. Finally, variations in transmitter output power will also affect signal strength at the receiver.

An automatic gain control (AGC) circuit and a variable gain amplifier (VGA) are often used at the receiver input to compensate for variations of received signal strength. More specifically, the AGC circuit adjusts the gain setting of the VGA to maintain the signal strength within a desired operating range. If the received signal strength is too high, then the AGC lowers the gain setting of the VGA. If the received signal strength is too low, then the AGC raises the gain setting of the VGA.

In order to properly compensate a received signal, the VGA should have a dynamic range that is equivalent to, or greater than, the range of variation in the received signal. In addition, the VGA should have a gain step size that is fine enough to avoid adding to much quantization noise to the received signal that would prevent useful information from being extracted. For example, quadrature amplitude modulation (QAM) with a 256-point constellation (256 QAM) is often used in cable television systems and requires a VGA step size to be less than about 0.03 dB for operation.

When a large gain control range (e.g., 40 dB) is required simultaneously with fine gain steps (e.g., 0.03 dB), continuously controllable VGAs are often employed. A continuously controllable VGA requires a continuous control voltage that is noise-free and has a very fine voltage resolution. Often, sigma-delta digital-to-analog converters (DACs) are used to provide this continuous control voltage. However, a drawback of sigma-delta DACs is that they generally require filtering components that cannot be integrated on chip with the remaining components of the VGA.

Therefore, what is needed is a PGA, with very fine gain steps and a large gain range.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. OPERATING ENVIRONMENT

Figure 1:
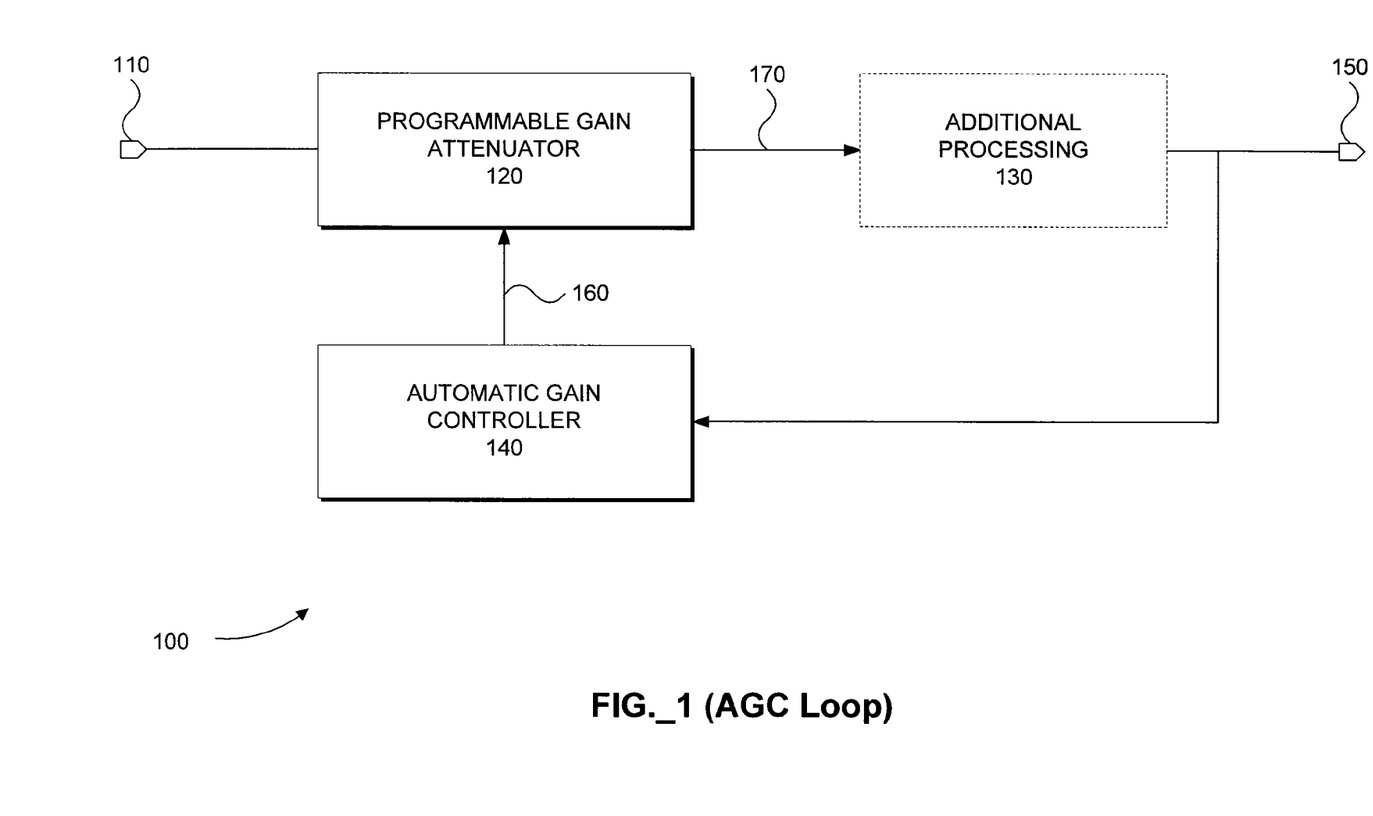
FIG. 1 illustrates a simplified block diagram of an automatic gain control (AGC) loop, according to embodiments of the present invention.

FIG. 1 illustrates a simplified block diagram of an automatic gain control (AGC) loop 100, according to embodiments of the present invention. AGC loop 100 can be used in several applications, including, for example, a communication receiver.

AGC loop 100 includes an input terminal 110, a programmable gain amplifier and/or attenuator (PGA) 120, additional processing 130, an automatic gain controller 140, and an output terminal 150. Input terminal 110 and output terminal 150 can be either single ended, differential, or any combination thereof. PGA 120 will be referred to herein as a programmable gain attenuator. However, it should be noted that PGA 120 can be a programmable gain amplifier. For example, a programmable attenuator can be coupled to an amplifier to form a programmable gain amplifier. In other instances, the distinction is somewhat academic as a programmable gain amplifier may amplify a signal by less than one.

In a communication receiver, automatic gain controller 140 and PGA 120 are used at the receiver input to compensate for variations in the signal strength of the received signal. Specifically, a signal received at input terminal 110 is first attenuated by PGA 120. The attenuated signal 170 is then passed to additional processing 130, which may include, for example, down conversion circuitry and/or a demodulator, for example. The output of additional processing 130 is provided at output terminal 150 and further provided as feedback to automatic gain controller 140. In another embodiment, attenuated signal 170 is directly feed back to automatic gain controller 140, before undergoing additional processing by additional processing block 130.

Automatic gain controller 140 examines the feedback signal and adjusts the attenuation setting of PGA 120, via control signal 160, to maintain the signal strength within a desired operating range. If the received signal strength is too high, then automatic gain controller 140 increases the attenuation setting of PGA 120. If the received signal strength is too low, then automatic gain controller 140 decreases the attenuation setting of PGA 120.

In order to properly compensate a received signal, PGA 120 should have a dynamic range that is equivalent to, or greater than, the range of variation in the received signal. In addition, PGA 120 should have an attenuation step size that is fine enough to avoid adding to much quantization noise to the received signal that would prevent useful information from being extracted. For example, quadrature amplitude modulation (QAM) with a 256-point constellation (256 QAM) is often used in cable television systems and requires a PGA step size that is very fine (e.g., less than 0.03 dB) for operation. In some instances a large attenuation control range (e.g., 40 dB) is required simultaneously with fine attenuation steps (e.g., 0.03 dB). Therefore, what is needed is a PGA, with very fine attenuation steps and a large attenuation range.

2. CONVENTIONAL PGA

An attenuator is configured to reduce the voltage, current, or power between its input and output ports by a known amount. Attenuators are generally two-port networks that can be, for example, resistive and/or capacitive. Embodiments of the present invention will be described with respect to resistive attenuator networks. However, as will be appreciated by one of ordinary skill in the art, the present invention is not limited to resistive attenuator networks and can be further implemented within additional types of attenuator networks (e.g., capacitive attenuator networks).

There are several different possible implementations for resistive based attenuators. For example, the simplest resistive attenuator is a set of resistances coupled in series that form a voltage divider. Each tap, or point between two series coupled resistors in the voltage divider, provides a different attenuation. By providing a number of selectable tapping points, the voltage divider forms a programmable gain attenuator.

More complex resistive attenuators are based on lattice networks, L networks, T networks, or pi networks of resistors. These networks provide 2 or more degrees of freedom so that, in addition to reducing the voltage by a specified amount, the circuit can also maintain an equivalent load resistance of 50Ω or any other desired value. When a number of symmetrical L, T, or pi networks are coupled in cascade to provide attenuation in steps, the resultant network is referred to as a ladder type attenuator.

Figure 2:
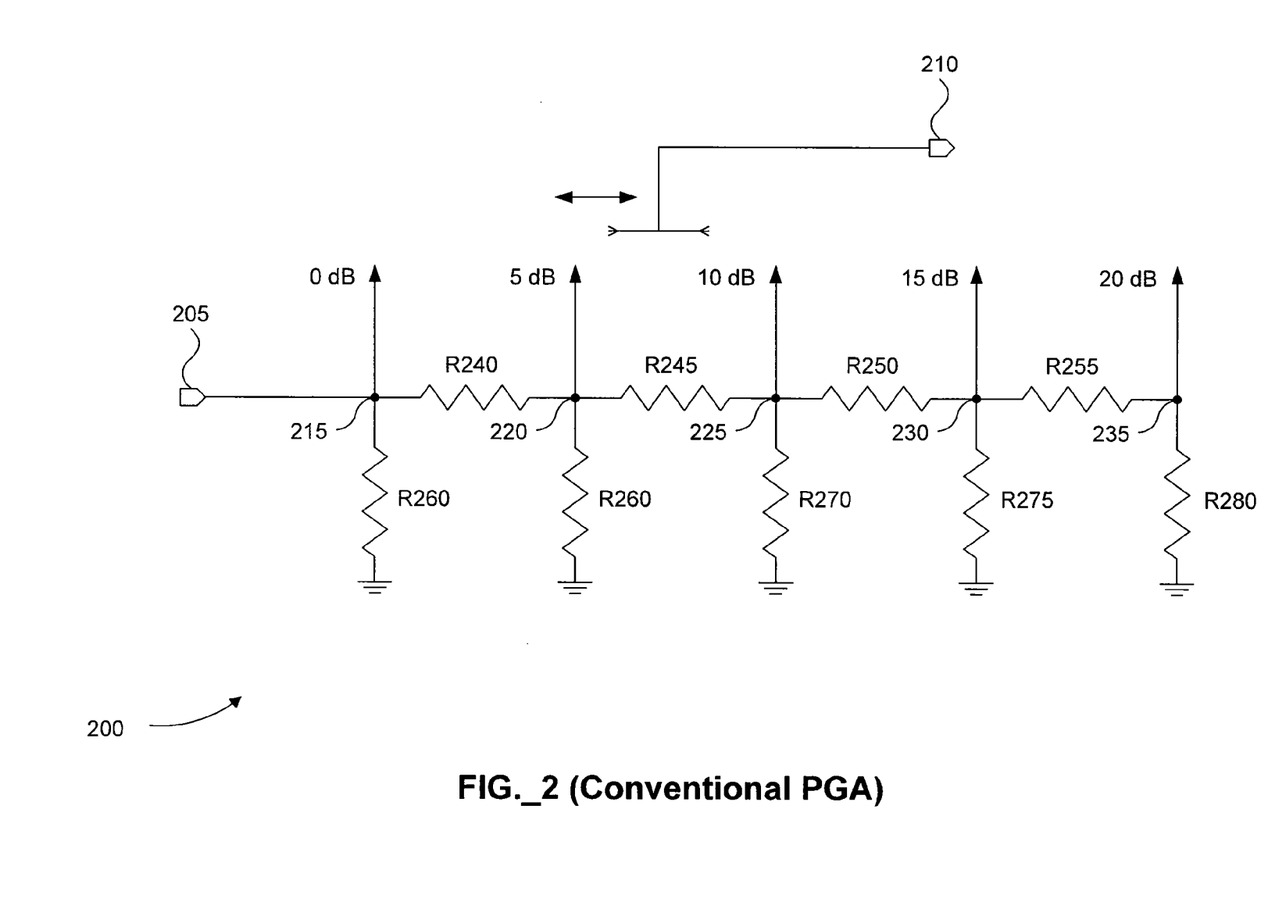
FIG. 2 illustrates a conventional PGA that implements an unbalanced ladder topology.

FIG. 2 illustrates a conventional PGA 200 that implements an unbalanced ladder topology. An input signal is received at input terminal 205 and an attenuated output signal is provided at output terminal 210. The output terminal is coupled to any one of the taps 215, 220, 225, 230, and 235. Each tap 215-235 provides a different level of attenuation. For example, coupling output terminal 210 to tap 215 provides 0 dB of attenuation, coupling output terminal 210 to tap 220 provides 5 dB of attenuation, and, the final tap 235, provides 20 dB of attenuation. The amount of attenuation provided by each tap is determined by the resistive network coupled between each respective tap and input terminal 205. In general, the further the input signal propagates through the chain of resistors R240-R280, the more the input signal is attenuated. As illustrated in FIG. 2, conventional PGA 200 has a dynamic attenuation range from 0 to 20 dB and a constant attenuation step size of 5 dB.

In general, additional resistors and taps can be added to PGA 200 to increase its dynamic attenuation range and to provide finer steps. However, such an approach rapidly becomes impractical in terms of size.

2. WIDE GAIN RANGE, FINE STEP SIZE PGA

Figure 3:
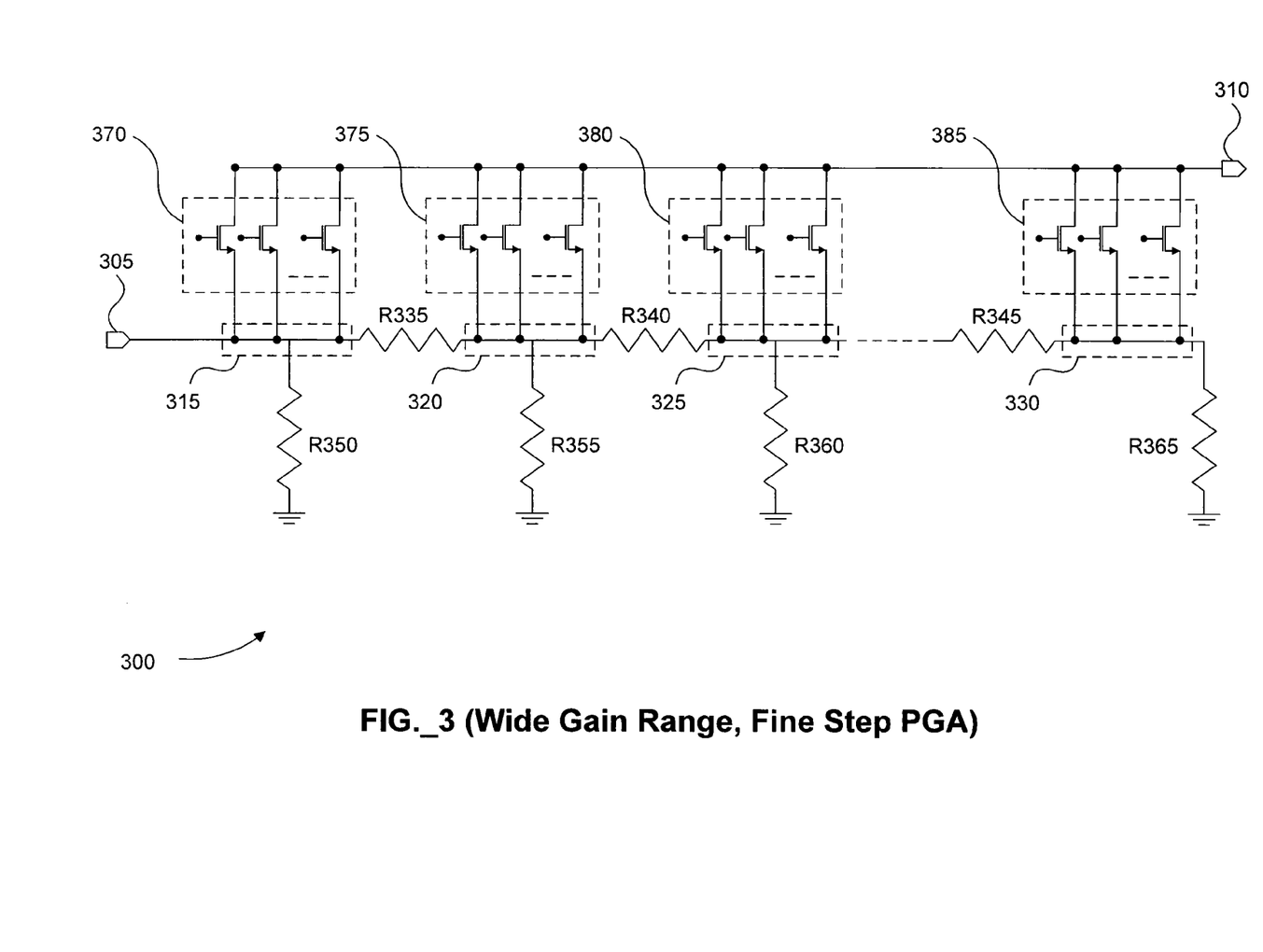
FIG. 3 illustrates a PGA with a wide gain range and fine step size, according to embodiments of the present invention.

FIG. 3 illustrates a PGA 300 with a wide gain range and fine step size, according to embodiments of the present invention. PGA 300 can be used in several applications, including, for example, an AGC loop, such as AGC loop 100 illustrated in FIG. 1. PGA 300 is configured to receive a signal at input terminal 305 and provide an attenuated version of the signal at output terminal 310. In an AGC loop, PGA 300 can be controlled to maintain the signal strength of the signal provided at output terminal 310 within a desired operating range. If the strength of the signal provided at output terminal 310 is too high, then the attenuation setting of PGA 300 can be increased. If the strength of the signal provided at output terminal 310 is too low, then the attenuation setting of PGA 300 can be decreased.

As illustrated in FIG. 3, PGA 300 includes a ladder-type attenuator formed by resistors R335-R365. The ladder-type attenuator illustrated in FIG. 3 is formed from a series of L attenuators. For example, resistors R335 and R350 form a first, inverted L attenuator and resistors R340 and R355 form a second, inverted L attenuator. It should be noted that PGA 300 is not limited to the particular ladder-type attenuator illustrated in FIG. 3. Rather, as will be appreciated by one of ordinary skill in the art, any suitable ladder-type attenuator can be used. In addition, as will be appreciated by one of ordinary skill in the art, other non-resistive based attenuators (e.g., capacitive based attenuators) can be used without departing from the scope and spirit of the present invention.

Between each L attenuator is a tapping point or tap. Specifically, there are 4 taps illustrated in FIG. 3, including tap 315, tap 320, tap 325, and tap 330. Each tap 315-330 is coupled to output terminal 310 through a different set of switches. Tap 315 is coupled to output terminal 310 through switch set 370, tap 320 is coupled to output terminal 310 through switch set 375, tap 325 is coupled to output terminal 310 through switch set 380, and tap 330 is coupled to output terminal 310 through switch set 385.

Switch sets 370-385 are configured to provide PGA 300 with both coarse and fine grain programmability. For example, assuming each L attenuator provides 5 dB of attenuation, one set of switches 370-385 can be controlled such that every switch in that set is on, while all other switches in the remaining sets of switches are off. If each switch in switch set 370 is on, while all other switches in the remaining switch sets are off, the signal received at input terminal 305 will undergo 0 dB of attenuation. If each switch in switch set 375 is on, while all other switches in the remaining switch sets are off, the signal received at input terminal 305 will undergo 5 dB of attenuation. If each switch in switch set 380 is on, while all other switches in the remaining switch sets are off, the signal received at input terminal 305 will undergo 10 dB of attenuation. This 5 dB coarse attenuation step size would continue, in the same manner, for each switch set in PGA 300.

To provide fine grain programmability between each coarse grain step of PGA 300, the switches within each switch set 370-385 can be independently controlled. For example, assuming a 5 dB coarse grain attenuation step size between each L attenuator, it is possible to control the switches within switch sets 370-385 to iterate through fine grain attenuation steps between 0 and 5 dB in size. Specifically, to iterate through the different fine grain attenuation steps, for each switch turned on within one set of switches on a first side of an L attenuator, one switch is turned off within the set of switches on the opposite side of the same L attenuator.

For example, if all switches within switch set 370 are on and all other switches within the remaining switch sets are off, 0 dB of attenuation is provided. To increase the attenuation by one fine grain attenuation step, one switch within switch set 370 can be turned off, while a corresponding switch in switch set 375 is turned on. To further increase the attenuation by another fine grain attenuation step, one more switch within switch set 370 can be turned off, while a corresponding switch in switch set 375 is turned on. This process can be repeated until all switches within switch set 370 are off and all switches within switch set 375 are on, thereby providing a final attenuation of 5 dB (assuming a 5 dB coarse grain step size). After all switches within switching set 375 are on, this same on/off iteration procedure can be repeated between switch sets 375 and 380 (and so forth). To decrease the attenuation, the same switching process can be repeated in reverse.

In one embodiment, each switch in switch sets 370-385 are implemented using metal-oxide semiconductor field effect transistors (MOSFETs) or, more specifically, N-type MOSFETs (NMOS devices). In a further embodiment, each switch set 370-385 contains two or more switches that are balanced by an equivalent number of switches in the switch set immediately adjacent to it. For example, assuming switch set 370 has 32 total switches, then switch set 375 (the switch set immediately adjacent to switch set 370) similarly will have 32 total switches. Although the switches in each switch set 370-385 are implemented as NMOS devices, it will be understood by one of ordinary skill in the art that any suitable switch can be used to construct switch sets 370-385 without departing from the scope and spirit of the present invention.

The NMOS devices, illustrated in FIG. 3, can provide fine grain attenuation steps because of their inherent resistance, which is proportional to the dimensions of their respective channels and to the voltage applied to their respective gates. Specifically, each NMOS device, when on, behaves as a resistor. As the number of switches turned on/off within a particular switch set changes, its total equivalent resistance changes, thereby changing the attenuation setting of PGA 300. In general, the more NMOS devices on within a particular set of switches the less resistance that switch set presents to an input signal. However, in order to provide near constant, fine grain step sizes, the dimensions of each NMOS switch, within PGA 300, can be scaled in size and impedance and switched on/off in the switching order as described further below in regard to FIG. 4.

Figure 4:
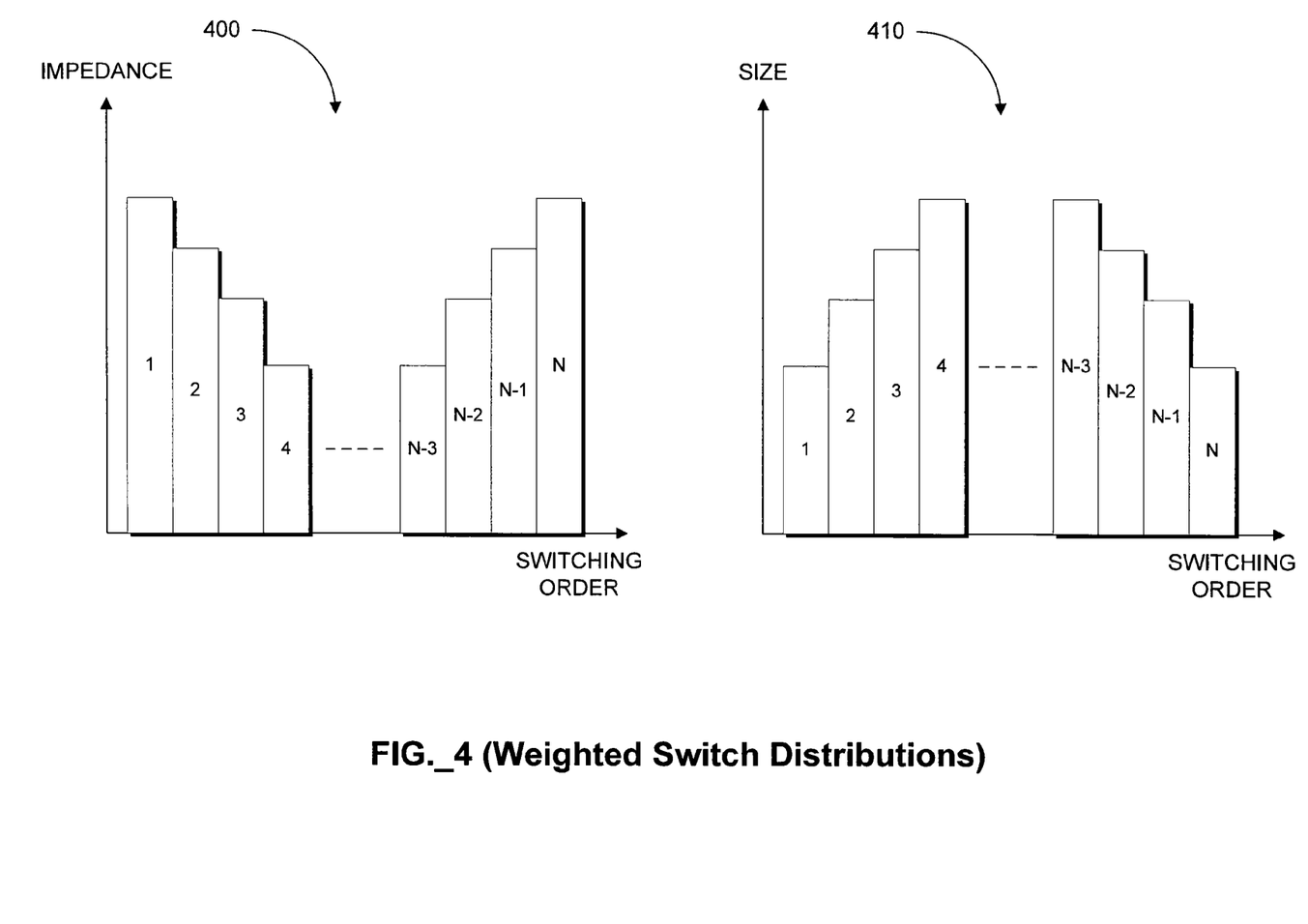
FIG. 4 illustrates two distributions of properties within one or more of the switch sets illustrated in FIG. 3, according to embodiments of the present invention.

FIG. 4 illustrates two distributions of properties within one or more of the switch sets illustrated in FIG. 3, according to embodiments of the present invention. Specifically, the first distribution 400 illustrates the impedance of each switch within a particular switch set (i.e., an impedance profile), such as switch set 370 illustrated in FIG. 3, versus the order in which they are switched on/off (i.e., a switching order). The second distribution 410 illustrates the size of each switch within the same particular switch set versus the order in which they are switched on/off. Each distribution 400 and 410 respectively illustrates the impedance and size (e.g., channel width and length dimensions) for a switch set having N total switches. Distributions 400 and 410 are non-uniform (i.e., the switches have varying impedances and sizes).

Assuming all switches within the switch set, represented by distributions 400 and 410, are all initially on, the first switch that is switched off, switch number 1, should have the largest impedance and the smallest size of the set. The second switch that is switched off, switch number 2, should have a smaller impedance and larger size than the first switch. The third switch that is switched off, switch number 3, should have a smaller impedance and larger size than the second switch. This decreasing impedance and increasing size trend should continue until the middle switch of the N total switches is reached. After this middle switch is reached (or a switch near the middle), the trend should reverse and the impedance of subsequent switches turned off should increase, and the size of each switch should decrease.

In the opposite scenario, when all switches within the switch set are initially off, the first switch that is switched on, switch number 1, should have the largest impedance and the smallest size of the set. The second switch that is switched on, switch number 2, should have a smaller impedance and larger size than the first switch. The third switch that is switched on, switch number 3, should have a smaller impedance and larger size than the second switch. This decreasing impedance and increasing size trend should continue until the middle switch of the N total switches is reached. After this middle switch is reached, the trend should reverse and the impedance of subsequent switches turned on should increase, and the size of each switch should decrease.

It should be noted that the impedance and size trends noted above do not have to be strictly followed. Specifically, the increasing and decreasing portions of the impedance and size distributions do not have to be strictly monotonically increasing and/or decreasing. Rather, the impedance and size generally should follow the increasing and decreasing trends discussed above. By following the impedance and size trends noted above, a more uniform gain versus control code pattern can be achieved.

To provide even finer grain attenuation step sizes, the voltage applied to the gate of each switch, within switch sets 370-385 illustrated in FIG. 3, can further be varied. Specifically, by varying the gate voltage of the NMOS switches with several different voltage levels, their effective resistances can be varied to change the amount of attenuation PGA 300 provides.

Figure 5:
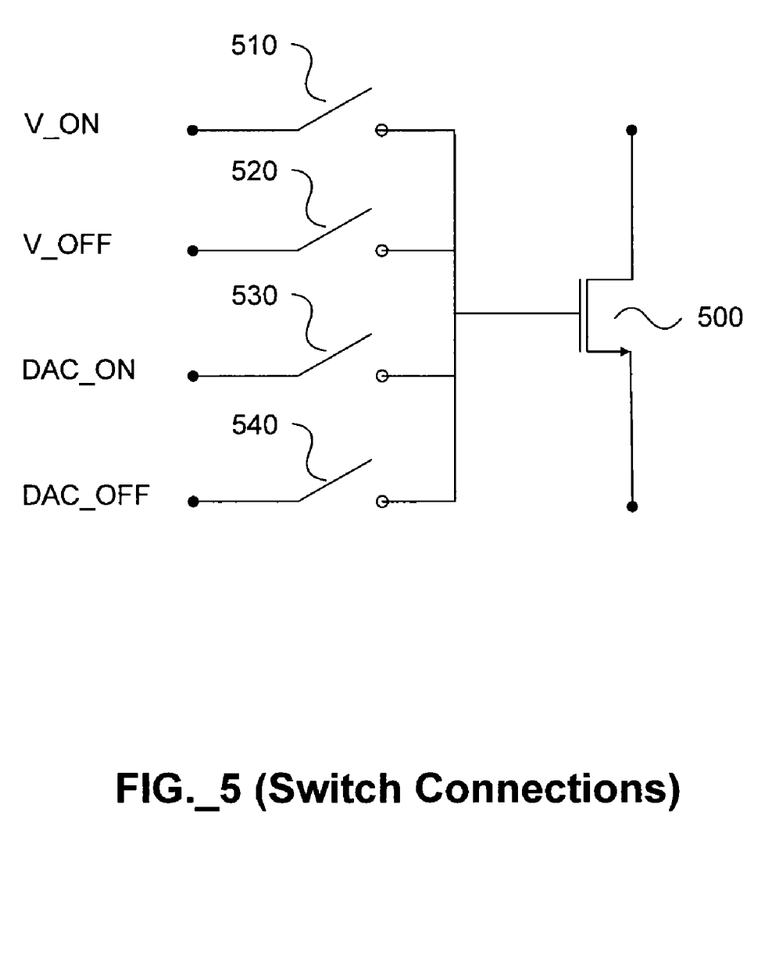
FIG. 5 illustrates a switch with various gate connections that can be implemented within the switch sets, illustrated in FIG. 3, to provide finer grain attenuation step sizes.

FIG. 5 illustrates a switch 500 that can be implemented within switch sets 370-385, illustrated in FIG. 3, to provide finer grain attenuation step sizes. As illustrated in FIG. 5, there are four separate connections coupled to the gate of switch 500. Specifically, the voltage signals V_ON, V_OFF, DAC_ON, and DAC_OFF are all coupled to the gate terminal of switch 500 via four different switches 510-540. At any given point, only one of the four voltage signals is coupled to switch 500. Voltage signal V_ON provides a sufficient voltage signal to turn switch 500 on and voltage signal V_OFF provides a sufficient voltage signal to turn switch 500 off. In one embodiment, V_ON and V_OFF respectively provide sufficient voltage signals to turn switch 500 completely on and completely off. Voltage signals DAC_ON and DAC_OFF provide a variable voltage level to the gate of switch 500 that varies the effective resistance between the source and drain terminals of switch 500. In effect, voltage signal DAC_ON and DAC_OFF are used to gradually, or incrementally, turn switch 500 either on or off.

In one embodiment, DAC_ON is used to control a first switch in one switch set 370-385, illustrated in FIG. 3, while DAC_OFF is used to control a second switch in a switch set immediately adjacent to the switch set in which the first switch is implemented. For example, as noted above in regard to FIG. 3, fine grain attenuation steps are iterated through by switching a switch on in one switch set, while switching another, corresponding switch off in an adjacent set. In the same manner, these corresponding switches can be respectively controlled by the voltage signals DAC_ON and DAC_OFF to provide even finer grain attenuation step sizes, before they are turned "completely" on or off.

Figure 6:
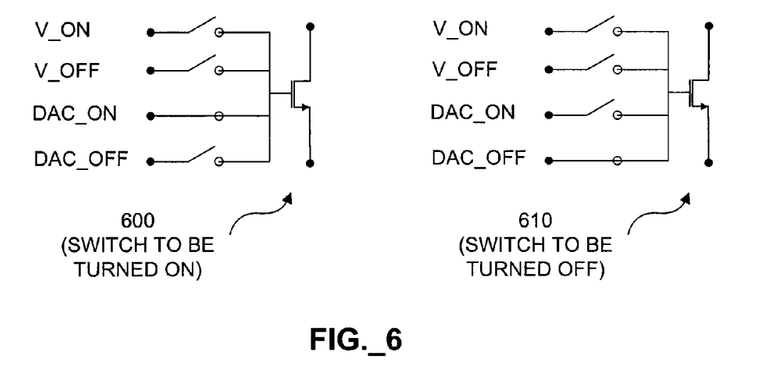
FIG. 6 illustrates a pair of corresponding switches, in adjacent switch sets, that are respectively coupled at their gates to variable voltage signals, according to embodiments of the present invention.

FIG. 6 illustrates a pair of corresponding switches 600 and 610, in adjacent switch sets, that are respectively coupled at their gates to voltage signals DAC_ON and DAC_OFF, according to an embodiment of the present invention. For example, switch 600 can be implemented as one of the switches within switch set 370, illustrated in FIG. 3, and switch 610 can be implemented as one of the switches within immediately adjacent switch set 375, further illustrated in FIG. 3. In an embodiment, only two corresponding switches within a PGA, such as PGA 300, are respectively coupled to voltage signals DAC_ON and DAC_OFF at any given time. The remaining switches are either coupled to voltage signals V_ON or V_OFF.

Figure 7:
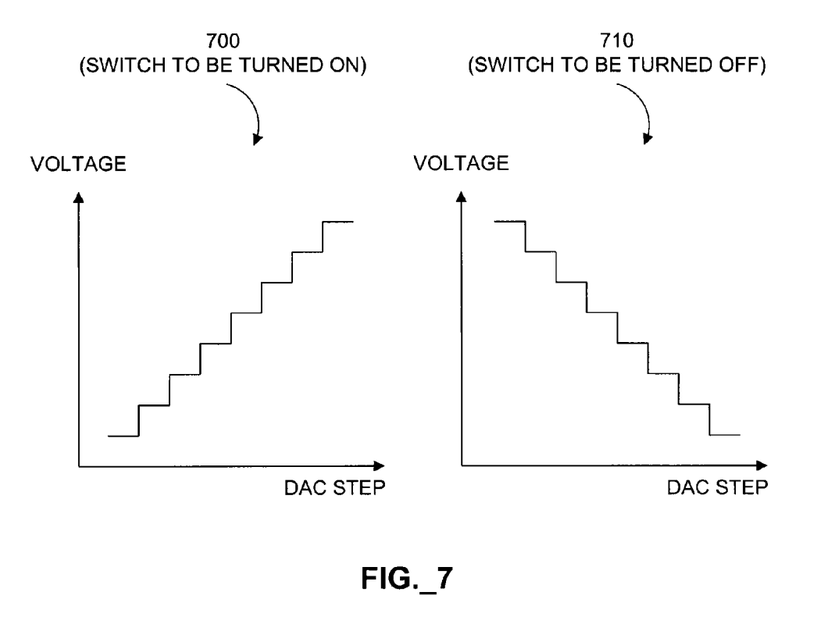
FIG. 7 illustrates a graph of each variable voltage signal coupled to the gates of the corresponding switches illustrated in FIG. 6, according to embodiments of the present invention.

FIG. 7 illustrates exemplary voltage steps that signals DAC_ON and DAC_OFF can iterate through to provide finer gain attenuation steps. In one embodiment, DAC_ON and DAC_OFF are provided by a digital-to-analog converter (DAC) and the granularity and number of voltage steps that voltage signals DAC_ON and DAC_OFF can iterate through is dependent upon the resolution of the DAC used.

FIG. 7 specifically illustrates the first DAC voltage signal, DAC_ON, in graph 700 and the second DAC voltage signal, DAC_OFF, in graph 710. The voltage signal DAC_ON is coupled to the first switch, of the two corresponding switches, that is to be turned on. The voltage signal DAC_OFF is coupled to the second switch, of the two corresponding switches, that is to be turned off. As can be seen by graphs 700 and 710, the DAC signals are stepped through to gradually turn on the first switch, while gradually turning off the second switch. Each step corresponds to a different resistance value for each of the two switches and, thereby, a different attenuation setting of the PGA. The two DAC output signals essentially change, or vary, in opposite directions.

In one embodiment, the DAC signals, DAC_ON and DAC_OFF, operate synchronously. In other words, the two signals operate synchronously such that the two switches are respectively and gradually turned on and off (substantially) simultaneously.

It should be noted that a DAC with more or less output voltage levels and resolution than shown in FIG. 7 can be used based on a desired attenuation step size without departing from the scope and spirit of the present invention.

3. CONCLUSION

Embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A programmable gain attenuator (PGA) configured to receive a signal at an input and provide an attenuated version of the signal at an output, comprising:
   a resistor coupled between a first tap and a second tap, wherein the first tap is coupled to the input;
   a first set of switches coupled in parallel between the first tap and the output;
   a second set of switches coupled in parallel between the second tap and the output; and
   a controller configured to control the first set of switches and the second set of switches such that for a switch turned off in the first set of switches a corresponding switch is turned on in the second set of switches,
   wherein the impedance of each switch in the first set of switches corresponds to an impedance value in a non-uniform impedance profile.

2. The PGA of claim 1, wherein a switching order of the first set of switches is determined based on the impedance of each switch in the first set of switches.

3. The PGA of claim 1, wherein the impedance of each switch in the first set of switches is defined by a width and a length of a channel associated with the switch.

4. The PGA of claim 1, wherein a first set of impedance values in the impedance profile follow a substantially decreasing impedance trend and correspond to a first subset of the switches in the first set of switches.

5. The PGA of claim 4, wherein a second set of impedance values in the impedance profile follow a substantially increasing impedance trend and correspond to a second subset of the switches in the first set of switches.

6. The PGA of claim 1, wherein a gate terminal of a first switch in the first set of switches is coupled to a first digital-to-analog converter (DAC) output signal, and a gate terminal of a second switch in the second set of switches is coupled to a second DAC output signal.

7. The PGA of claim 6, wherein a voltage magnitude of the first DAC output signal and a voltage magnitude of the second DAC output signal are configured to vary in opposite directions.

8. The PGA of claim 7, wherein an attenuation setting of the PGA is determined, at least in part, based on the voltage magnitude of the first DAC output and the voltage magnitude of the second DAC output.

9. A method for adjusting a gain of a programmable gain attenuator (PGA) configured to receive a signal at an input and provide an attenuated version of the signal at an output, the PGA having a resistor coupled between a first tap and a second tap, a first set of switches coupled in parallel between the first tap and the output, and a second set of switches coupled in parallel between the second tap and the output, the first tap being further coupled to the input, the method comprising:
receiving a signal to increment an attenuation setting of the PGA by a single attenuation step;
in response to receiving the signal, turning off a first switch in the first set of switches and turning on a corresponding second switch in the second set of switches; and
selectins; the first switch to turn off, in response to receiving, the signal, on a switching order, wherein the switching older is determined based on respective impedances of the switches in the first set, of switches.

10. The method of claim 9, wherein turning off the first switch in the first set of switches and turning on the corresponding second switch in the second set of switches further comprises:
incrementally turning off the first switch by incrementally decreasing a voltage applied to a gate terminal of the first switch; and
incrementally turning on the second switch by incrementally increasing a voltage applied to a gate terminal of the second switch.

11. The method of claim 9, wherein the first set of switches have a non-uniform impedance profile.

12. The method of claim 11, wherein a first set of impedance values in the impedance profile follow a substantially decreasing impedance trend and correspond to a first subset of the switches in the first set of switches.

13. The PGA of claim 12, wherein a second set of impedance values in the impedance profile follow a substantially increasing impedance trend and correspond to a second subset of the switches in the first set of switches.

* * * * *

UNITED STATES PATENT AND TRADEMARK OFFICE
CERTIFICATE OF CORRECTION

PATENT NO.        : 8,299,870 B2
APPLICATION NO.   : 12/689549
DATED             : October 30, 2012
INVENTOR(S)       : Tao Wu

It is certified that error appears in the above-identified patent and that said Letters Patent is hereby corrected as shown below:

Column 10, Line 1, please replace "selectins;" with --selecting--.

Column 10, Line 2, please replace ", the signal, on" with --the signal, based on--.

Column 10, Line 4, please replace "set, of" with --set of--.

Signed and Sealed this
Fifteenth Day of January, 2013

David J. Kappos
*Director of the United States Patent and Trademark Office*